(12) United States Patent
Hirata (10) Patent No.: US 6,816,540 B2
(45) Date of Patent: Nov. 9, 2004

(54) AFC CONTROL APPARATUS AND METHOD IN MOBILE COMMUNICATION SYSTEM AND MOBILE COMMUNICATION EQUIPMENT USING THE APPARATUS AND METHOD

(75) Inventor: Masaru Hirata, Tokyo (JP)

(73) Assignee: NEC Corporation, Tokyo (JP)

( * ) Notice: Subject to any disclaimer, the term of this patent is extended or adjusted under 35 U.S.C. 154(b) by 747 days.

(21) Appl. No.: 09/734,699

(22) Filed: Dec. 13, 2000

(65) Prior Publication Data

US 2001/0004373 A1 Jun. 21, 2001

(30) Foreign Application Priority Data

Dec. 15, 1999 (JP) .......................................... 11-355375

(51) Int. Cl.[7] .............................. H04B 1/69; H03K 9/00; H04L 27/06
(52) U.S. Cl. ........................ 375/147; 375/316; 375/344
(58) Field of Search ................................ 375/200, 205, 375/206, 208, 209, 210, 367, 81, 118–120, 147, 316, 344; 370/335, 341, 342

(56) References Cited

U.S. PATENT DOCUMENTS

| | | | | |
|---|---|---|---|---|
| 5,278,874 A | * | 1/1994 | Liu et al. ..................... | 375/376 |
| 5,579,338 A | * | 11/1996 | Kojima ........................ | 375/149 |
| 5,602,832 A | * | 2/1997 | Hudson ....................... | 370/342 |
| 5,638,362 A | * | 6/1997 | Dohi et al. .................. | 370/342 |
| 5,666,352 A | * | 9/1997 | Ohgoshi et al. ............ | 370/206 |
| 5,818,882 A | * | 10/1998 | Komatsu ..................... | 375/344 |
| 5,898,665 A | * | 4/1999 | Sawahashi et al. ......... | 370/342 |
| 5,974,038 A | * | 10/1999 | Shou et al. .................. | 370/335 |

FOREIGN PATENT DOCUMENTS

| | | |
|---|---|---|
| EP | 0 750 408 | 12/1996 |
| EP | 0 845 860 | 6/1998 |
| EP | 0 892 528 | 1/1999 |
| JP | 07-074726 | 3/1995 |
| JP | 7-123024 | 5/1995 |
| JP | 9-200081 | 7/1997 |
| JP | 9-298492 | 11/1997 |
| JP | 9-331307 | 12/1997 |
| JP | 10-210095 | 8/1998 |
| JP | 10-224420 | 8/1998 |

OTHER PUBLICATIONS

European Search Report dated Aug. 15, 2003.
Patent abstract of Japan, Publication # 09331307 dated Dec. 22, 1997.
Japanese office action with English translation of pertinent portion dated Jan. 21, 2003.
Japanese Office Action with English translation of pertinent portions dated Oct. 15, 2002.

* cited by examiner

*Primary Examiner*—Stephen Chin
*Assistant Examiner*—Jason M. Perilla
(74) *Attorney, Agent, or Firm*—Whitham, Curtis & Christofferson, PC (57) ABSTRACT

An AFC control apparatus in mobile communication equipment includes a depreading unit, first integrator, and control section. A despreading section despreads the reception signal. The first integrator integrates despread outputs obtained by despreading, of pilot symbols contained in a pilot channel of the reception signal, N (N is a number of 2 or more) consecutive first symbols and N second symbols succeeding the N first symbols, and generates first and second integral outputs. The control section detects any phase shift amount between the first and second integral outputs and controls the frequency of the local signal in accordance with the detected phase shift amount. An AFC control method and mobile communication equipment having the above apparatus and method are also disclosed.

12 Claims, 10 Drawing Sheets

$$I_1 = \int_0^{T/2} \cos\theta \, dt \quad \text{or} \quad \int_0^{2T} \cos\theta \, dt$$

$$I_2 = \int_{T/2}^{T} \cos\theta \, dt \quad \text{or} \quad \int_{2T}^{4T} \cos\theta \, dt$$

$$Q_1 = \int_0^{T/2} \sin\theta \, dt \quad \text{or} \quad \int_0^{2T} \sin\theta \, dt$$

$$Q_2 = \int_{T/2}^{T} \sin\theta \, dt \quad \text{or} \quad \int_{2T}^{4T} \sin\theta \, dt$$

$D_1 : I_1 + jQ_1 , D_2: I_2 + jQ_2$

PHASE DIFFERENCE $\theta = (I_1 \cdot I_2 + Q_1 \cdot Q_2) + j(I_1 \cdot Q_2 - Q_1 \cdot I_2)$

AFC CONTROL APPARATUS AND METHOD IN MOBILE COMMUNICATION SYSTEM AND MOBILE COMMUNICATION EQUIPMENT USING THE APPARATUS AND METHOD

BACKGROUND OF THE INVENTION

1. Field of the Invention

The present invention relates to an AFC control apparatus and method in a mobile communication system and mobile communication equipment using these apparatus and method and, more particularly, to an AFC control apparatus and method in CDMA mobile communication equipment, which receive a spread signal obtained by phase-modulating a baseband signal, multiply this reception signal with a local signal to obtain a baseband signal, and despread this baseband signal.

2. Description of the Prior Art

In recent years, a CDMA (Code Division Multiple Access) communication scheme resistant to radio interference and invasion attempts have received a great deal of attention as a communication scheme used in a mobile communication system. In CDMA, the transmitting side spreads a user signal using a spreading code and transmits a spread signal. The receiving side despreads the reception signal using the same spreading code as that on the transmitting side to obtain an original user signal.

The CDMA communication scheme does not allow despreading reading on the receiving side unless the phase of the spreading code sequence on the transmitting side is locked with that on the receiving side. For this purpose, a mobile station uses a reference oscillator TCXO (Temperature Controlled Xtal Oscillator) for generating a reference frequency signal used for demodulating a signal received from base station. At the same time, the mobile station performs AFC (Automatic Frequency Control) control for matching the frequency of the reference frequency signal with that of the reference frequency signal of the transmitting base station. This AFC control is performed with reference to a pilot symbol contained in data transmitted on the base station.

Figure 1:
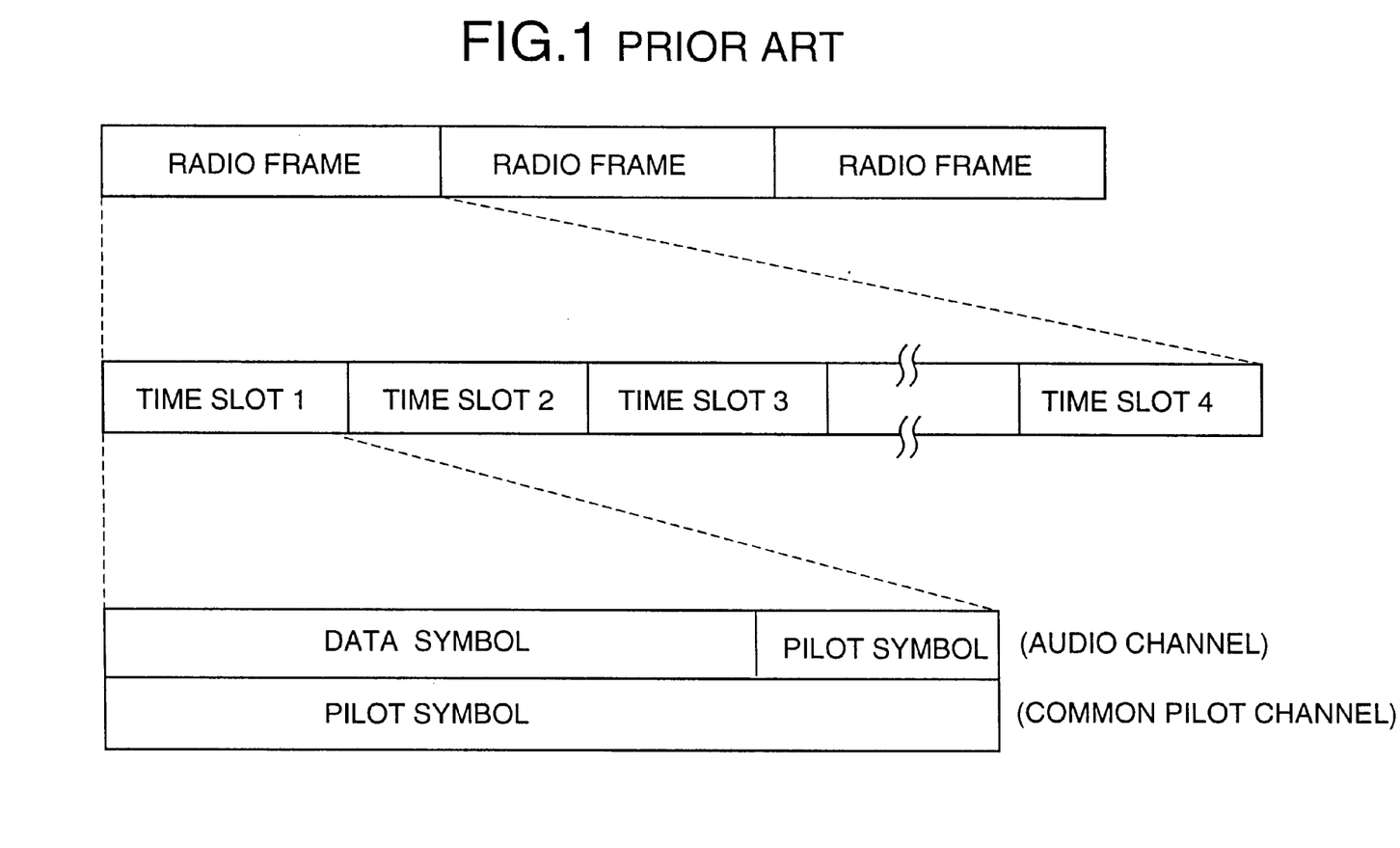
FIG. 1 is a signal format chart of data in a CDMA communication scheme.

The signal format of a downstream channel serving as a channel from the base station to the mobile station will be described with reference to FIG. 1. Transmission data from the base station is constituted by a plurality of radio frames having intervals of 10 ms. Each radio frame consists of 16 time slots. Each time slot is used to simultaneously output an audio channel and common pilot channel. These channels are spread using different spreading codes (both are known). In the audio channel, audio data is formed into a data symbol and transmitted together with a plurality of pilot symbols (e.g., two symbols). In the pilot channel, only pilot symbols containing a variety of control information is transmitted. For example, the pilot channel has 10 pilot symbols.

The pilot symbols of the audio channels are different in different time slots, but have a predetermined pattern. For this reason, the mobile station can anticipate a pilot symbol before it is received. The data symbol is used for information such as audio information. The mobile station can measure any frequency error using this pilot symbol with respect to the frequency of the base station.

This frequency error will be described with reference to FIG. 2. The CDMA communication scheme uses QPSK (Quadrature Phase Shift Keying) as a linear modulation scheme before spreading and modulation. Each symbol is 2-bit data which takes any one of (0,0), (0,1), (1,0), and (1,1). These values are plotted on the vector diagram shown in FIG. 2. In other words, FIG. 2 shows the phase shift amounts of pilot symbols used in frequency error measurements for AFC control.

Figure 2:
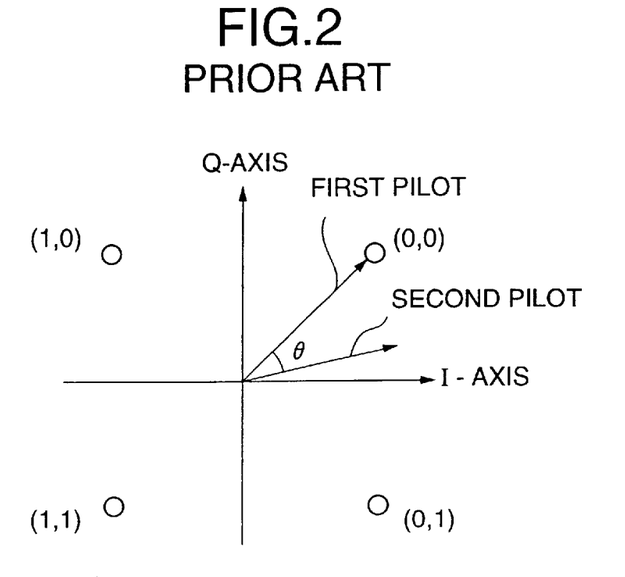
FIG. 2 is a view showing the coordinates of the phase shift amount of the pilot symbols used in frequency error measurement for AFC control.

In FIG. 2, the magnitude of the in-phase (I) component is plotted along the abscissa, while the magnitude of the quadrature component (Q) is plotted along the ordinate. The vector of transmission data from the base station takes one of (0,0), (0,1), (1,0), and (1,1). If the vector of transmission data is predetermined like a pilot symbol, all pilot symbols can be plotted on the vector diagram by directly plotting (0,0) and rotating (0,1), (1,0), and (1,1), respectively, through +90 degrees, −90 degrees, and 180 degrees.

If a frequency error $\theta$ is present in the mobile station, the actually measured data of the pilot symbol located on (0,0) seems to be phase-shifted from the vector of the first pilot symbol to the vector of the second pilot symbol, as shown in FIG. 2. This frequency error $\theta$ is converted into a voltage, and the control voltage of the TCXO is controlled.

Figure 3:
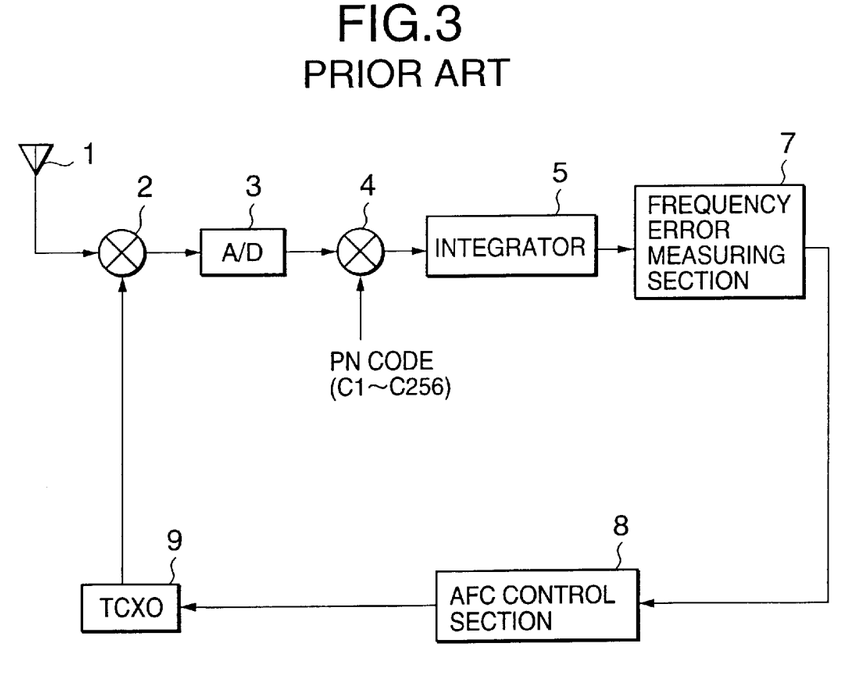
FIG. 3 is a block diagram showing the schematic arrangement of a conventional AFC control apparatus.

AFC control will be described with reference to FIG. 3. An antenna 1 receives a signal transmitted from the base station. A mixer 2 removes a carrier wave from the reception signal to obtain a baseband signal. An A/D converter 3 converts this baseband signal into a digital signal. A despreading section 4 multiplies the digital signal with a PN code (despreading code: C1 to C256 for a spread rate of 256) to obtain a despread signal. An integrator 5 obtains the integral of one symbol of the despread output, thereby generating one-symbol data.

A frequency error measuring section 7 calculates a frequency error value using the pilot symbols of the symbol data. An AFC control section 8 converts the calculated frequency error value into a control voltage for a TCXO 9 to control the frequency of the TCXO 9. The phase shift angle between the adjacent symbols is measured using the pilot symbols of the symbol data obtained from the integrator 5. The phase shift angle is converted into a frequency error value, and the TCXO is controlled with the control voltage.

Exemplifying the relationship between the phase rotation amount (phase shift amount) and frequency error between adjacent symbols, when the symbol rate and the phase rotation amount between the first and second pilot symbols are 15 ksps and 90 degrees, respectively, the frequency error is given by Frequency Error $\theta$=15 ksps×(90 degrees/360 degrees)=3.75 kHz If the frequency of the carrier wave is 2 GHz, a shift of 3.75 kHz becomes a frequency error value of 3.75 kHz/2 GHz=1.875 ppm.

Figure 4A:
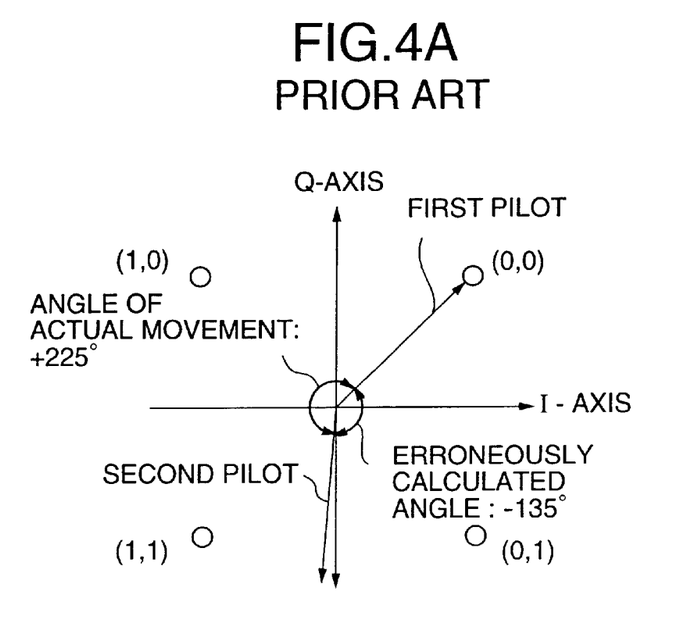
FIGS. 4A and 4B are views showing the coordinates of phase shift amount measurement in control operation of the conventional AFC control apparatus shown in FIG. 3.

Assume that the frequency error value of the TCXO reference frequency in initial setting is large, e.g., 5 ppm (when an inexpensive TCXO is used to reduce the unit cost of a mobile station, the initial frequency error value is about 5 ppm). In this case, as shown in FIG. 4A, the phase shift angle between the adjacent symbols is +225 degrees, exceeding +180 degrees. The actually measured phase shift amount is calculated not as +225 degrees, but as −135 degrees in the erroneous symbol moving direction, resulting in AFC control error.

Japanese Unexamined Patent Publication No. 9-331307 proposes a frequency control technique of dividing one symbol into a plurality of portions, e.g., first and second half portions in place of using an intersymbol phase shift amount, and obtaining a phase shift amount between the symbol data of the first and second half portions.

Figure 5:
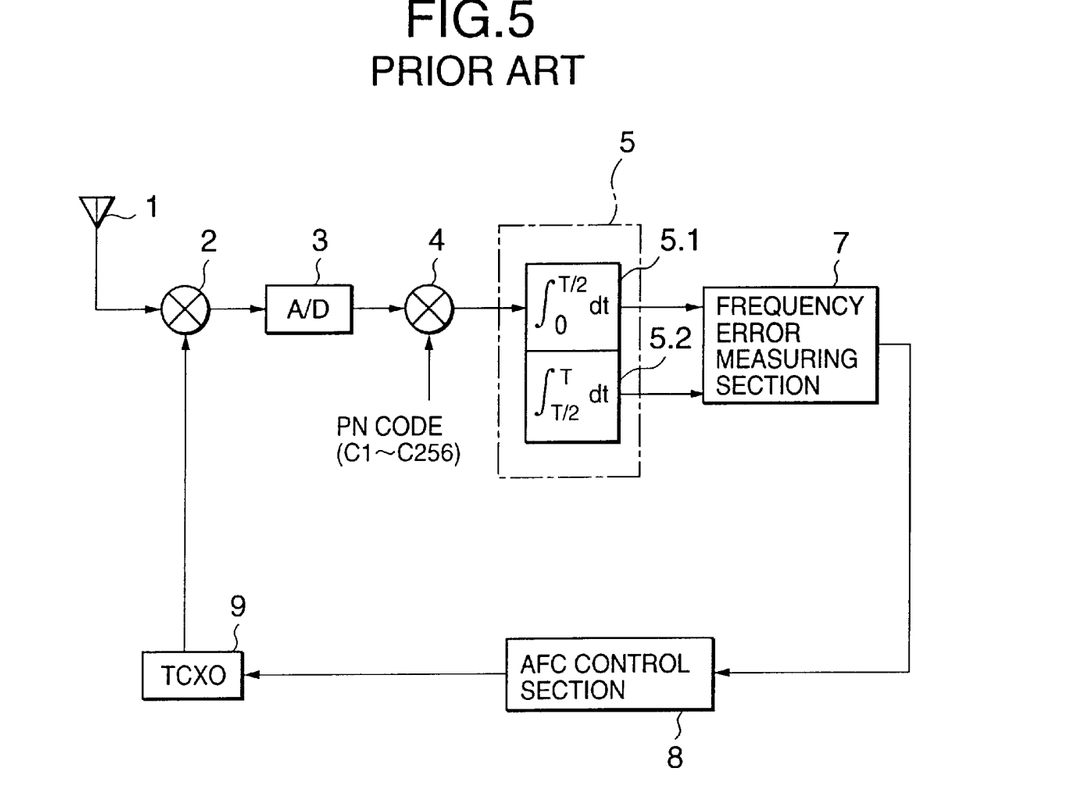
FIG. 5 is a block diagram showing the schematic arrangement of another conventional AFC control apparatus.

FIG. 5 is a block diagram showing AFC control disclosed in this reference. The same reference numerals as in FIG. 3 denote the same parts in FIG. 5. Only parts different from FIG. 3 will be described with reference to FIG. 5. An integrator 5 comprises two integrators 5.1 and 5.2 for integral data of the first half portion (0 to T/2; T is a symbol period) and the second half portion of one symbol. A frequency error measuring section 7 calculates a phase shift amount between outputs from these two integrators, thereby obtaining a frequency error.

Figure 6:
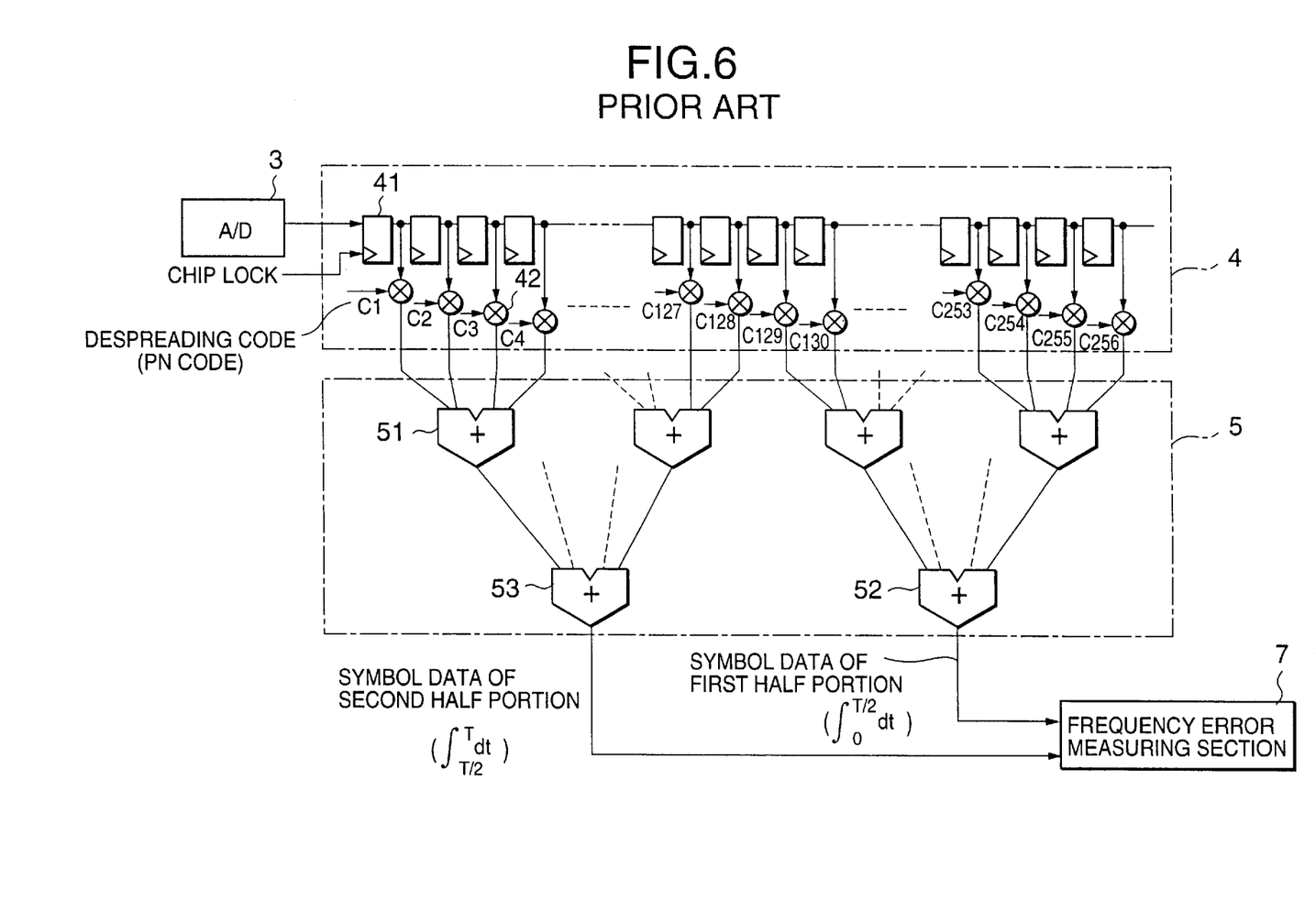
FIG. 6 is a block diagram showing the detailed arrangement of part of the prior art shown in FIG. 5.

The detailed arrangement of a despreading section 4 and the integrator 5 in FIG. 5 is shown in FIG. 6. Output data from an A/D converter 3 is sequentially latched by cascade-connected F/Fs (flip-flops) 41 at chip clock timings. Multipliers 42 multiply these latch outputs with despreading codes C1 to C256 (for a spread rate of 256) to obtain product signals. Adders 51 to 53 constructing the integrator 5 add these product signals. At this time, the adder 52 outputs the sum data (integral) of the first half portion (first product output to 129th product output) of 0 to T/2 of one symbol. The adder 53 outputs the sum data of the second half portion (130th product output to 256th product output) of T/2 to T of one symbol.

Figure 4B:
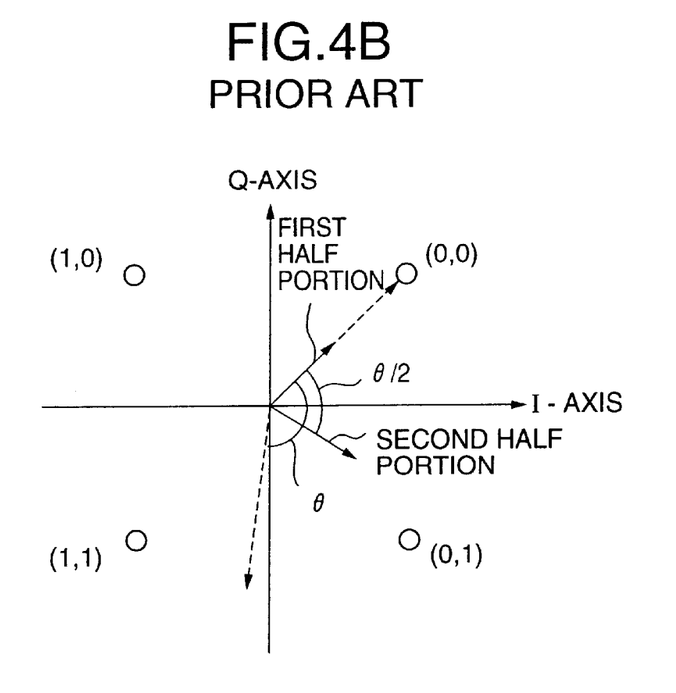

With the above arrangement, as shown in FIG. 4B, the phases of the integral data of the first and second half portions are reduced to ½ as compared with the case (measurement of the phase shift amount of one-symbol data) in FIG. 4A. The operation error shown in FIG. 4A can be eliminated.

Exemplifying the relationship between the phase rotation amount (phase shift amount) and frequency error between the symbol data of the first and second half portions of one symbol for a reference, when the symbol rate and the phase rotation amount (first and second half portions) within one symbol are 15 ksps and 90 degrees, respectively, the frequency error is given $$\text{Frequency Error } \theta = 2 \times 15 \text{ ksps} \times (90 \text{ degrees}/360 \text{ degrees}) = 7.5 \text{ kHz}$$

The relationship between the phase shift amount and frequency error of the first and second half portions of one symbol is described in the above reference in detail, and a detailed description thereof will be omitted. In the technique disclosed in Japanese Unexamined Patent Publication No. 9-331307, even if the error of the local signal frequency becomes below a predetermined threshold value to allow stable AFC control upon executing AFC control, one symbol is divided into a plurality of portions, e.g., first and second half portions, and AFC control is performed on the basis of the phase shift amount between the symbol data of the first and second half portions. This control is susceptible to the adverse influence of noise.

Figure 11A:
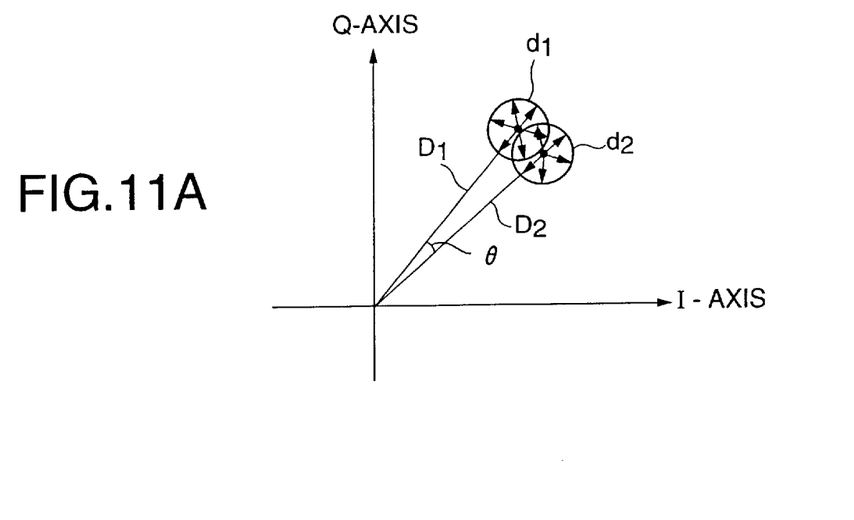
FIGS. 11A to 11C are views showing the coordinates for explaining the influences of noise on the phase shift amount when AFC control is stable.

More specifically, as shown in FIG. 11A, assume that the vectors of symbol data of the first and second half portions are represented by D1 and D2, respectively, and that the phase shift amount between them is θ (θ≦threshold value). In this case, the distal ends of the vectors of these data trace a circle having a predetermined radius (magnitude of noise), as indicated by d1 and d2. The instantaneous phase shift amount between them changes within the range of ±θ.

In the above reference, the phase shift amount is calculated within one symbol (first and second half portions). The integrating time for calculating this phase shift amount is as short as T/2. In AFC control state in which the frequency error is smaller than the threshold value from the beginning, the phase shift amount influenced by noise is also small. It is difficult to accurately calculate the phase shift amount. As a result, this AFC scheme is susceptible to the adverse influence of noise.

SUMMARY OF THE INVENTION

The present invention has been made in consideration of the above situation in the prior art, and has as its object to provide an AFC control apparatus and method in a mobile communication system, which are capable of AFC control without being adversely influenced by noise, and mobile communication equipment using these AFC control apparatus and method.

In order to achieve the above object, according to the first aspect of the present invention, there is provided an AFC control apparatus in mobile communication equipment, which receives a spread signal obtained by phase-modulating a baseband signal, multiplies the reception signal with a local signal to obtain a baseband signal, and despreads the baseband signal, comprising despreading means for despreading the reception signal, first integrating means for integrating despread outputs obtained by despreading, of pilot symbols contained in a pilot channel of the reception signal, N (N is a number of not less than 2) consecutive first symbols and N second symbols succeeding the N first symbols, and generating first and second integral outputs, and control means for detecting a phase shift amount between the first and second integral outputs and controlling a frequency of the local signal in accordance with the detected phase shift amount.

In order to achieve the above object, according to the second aspect of the present invention, there is provided an AFC control method in mobile communication equipment, which receives a spread signal obtained by phase-modulating a baseband signal, multiplies the reception signal with a local signal to obtain a baseband signal, and despreads the baseband signal, comprising the despreading step of despreading the reception signal, the first integrating step of integrating despread outputs obtained by despreading, of pilot symbols contained in a pilot channel of the reception signal, N (N is a number of not less than 2) consecutive first symbols and N second symbols succeeding the N first symbols, and generating first and second integral outputs in the despreading step, and the control step of detecting a phase shift amount between the first and second integral outputs and controlling a frequency of the local signal in accordance with the detected phase shift amount.

In order to achieve the above object, according to the third aspect of the present invention, there is provided an AFC control method in mobile communication equipment, which receives a spread signal obtained by phase-modulating a baseband signal, multiplies the reception signal with a local signal to obtain a baseband signal, and despreads the baseband signal, comprising the despreading step of despreading the reception signal in response to power-on, the step of dividing a despread output of one symbol of the reception signal in the despreading step and integrating the divided despread outputs, the step of detecting a phase shift amount between the divided integral outputs in the integrating step and performing the frequency control, the step of, when the phase shift amount is less than a predetermined threshold value, integrating despread outputs obtained by despreading, of pilot symbols contained in a pilot channel of the reception signal, N (N is a number of not less than 2) consecutive first symbols and N second symbols succeeding the N first symbols, and generating first and second integral outputs, and the control step of detecting a phase shift amount between the first and second integral outputs and controlling a frequency of the local signal in accordance with the detected phase shift amount.

In order to achieve the above object, according to the fourth aspect of the present invention, there is provided CDMA mobile communication equipment using the AFC control apparatus described in the first aspect and the AFC control method described in the second or third aspect.

The function and effect of the present invention are as follows. When a frequency error in the initial state upon power-on is large, AFC control (coarse control) is performed using a phase shift amount within one symbol to allow accurate AFC control within a short period of time. When the frequency error becomes small to obtain a stable state, AFC control (fine control) is performed using the phase shift amounts of the N consecutive first symbols of the pilot channel and the N second symbols succeeding the N first symbols. Any adverse influence of noise on the phase shift amount in the stable state can be minimized. Stable AFC control free from noise can be attained.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF PREFERRED EMBODIMENT

A preferred embodiment of the present invention will be described with reference to the accompanying drawings.

Figure 7:
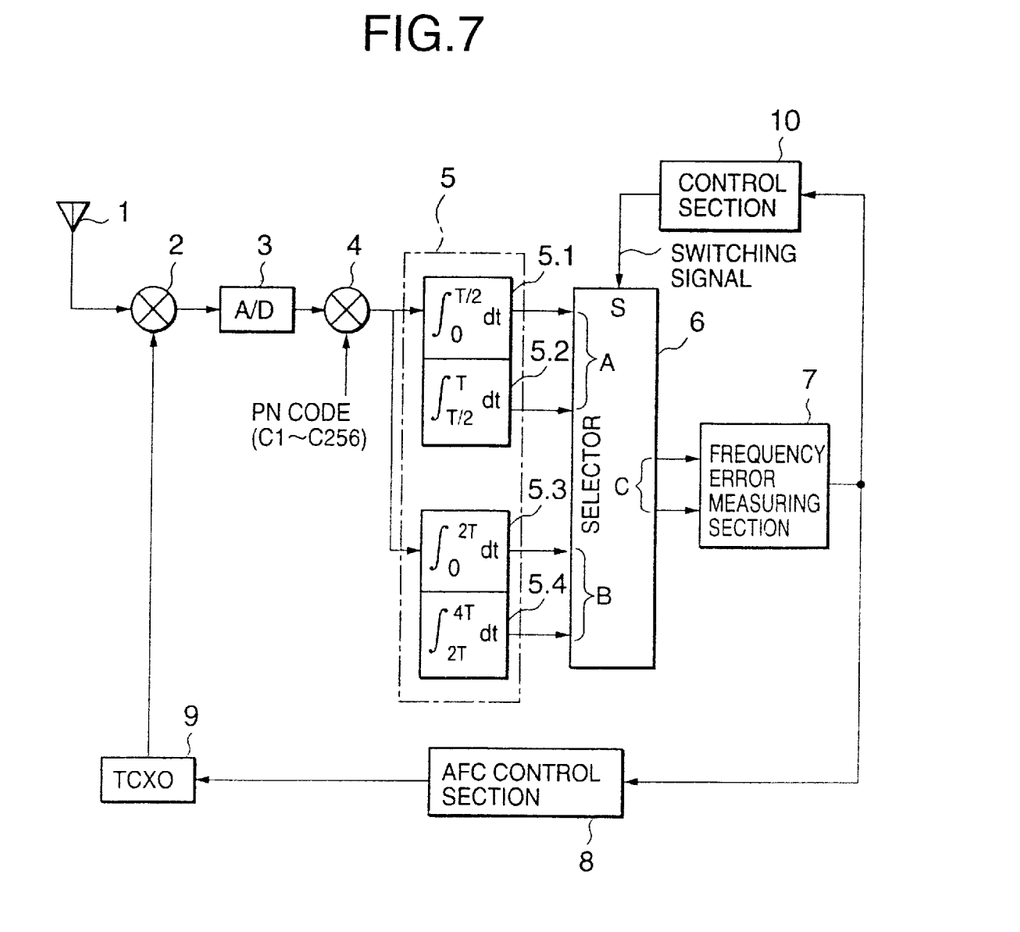
FIG. 7 is a block diagram showing the schematic arrangement of an embodiment of the present invention.

FIG. 7 is a block diagram showing the schematic arrangement of an embodiment according to the present invention. The same reference numerals as in the prior art of FIG. 9 denote the same parts in FIG. 7. An antenna 1 receives a data signal transmitted from a base station (not shown). A mixer 2 removes a carrier wave from the reception signal to obtain a baseband signal. An A/D converter 3 converts this baseband signal into a digital signal. A despreading section 4 multiplies the digital signal with PN codes C1 to C256 (for a spread rate of 256) serving as spreading codes, thereby obtaining despread signals.

These despread signals are input to an integrator 5 to integrate despread symbol data. The integrator 5 comprises four integrators 5.1 to 5.4. The integrators 5.1 and 5.2 calculate the integrals of the first half portion (0 to T/2) and the second half portion (T/2 to T) of one symbol, and the integrators 5.3 and 5.4 calculate the integrals of two consecutive symbols (0 to 2T) and two symbols (2T to 4T) succeeding the first two consecutive symbols. The symbols to be integrated are the pilot symbols of the common pilot channel shown in the format of FIG. 5.

A pair of integral outputs from the integrators 5.1 and 5.2 are input to the A-side input terminal of a selector 6. The other pair of integral outputs from the integrators 5.3 and 5.4 are input to the B-side input terminal of the selector 6. The A- or B-side input signals appear at a pair of output terminals C of the selector in accordance with a switching signal. The pair of selector outputs are supplied to a frequency error measuring section 7 to calculate a frequency error. Via an AFC control section 8, the frequency error becomes a control signal for a TCXO 9 for generating a local signal. The measurement value of the frequency error measuring section 7 is also input to a control section 10 and compared with a predetermined threshold value input in advance. The selector 6 is switched in accordance with the comparison result.

Figure 8:
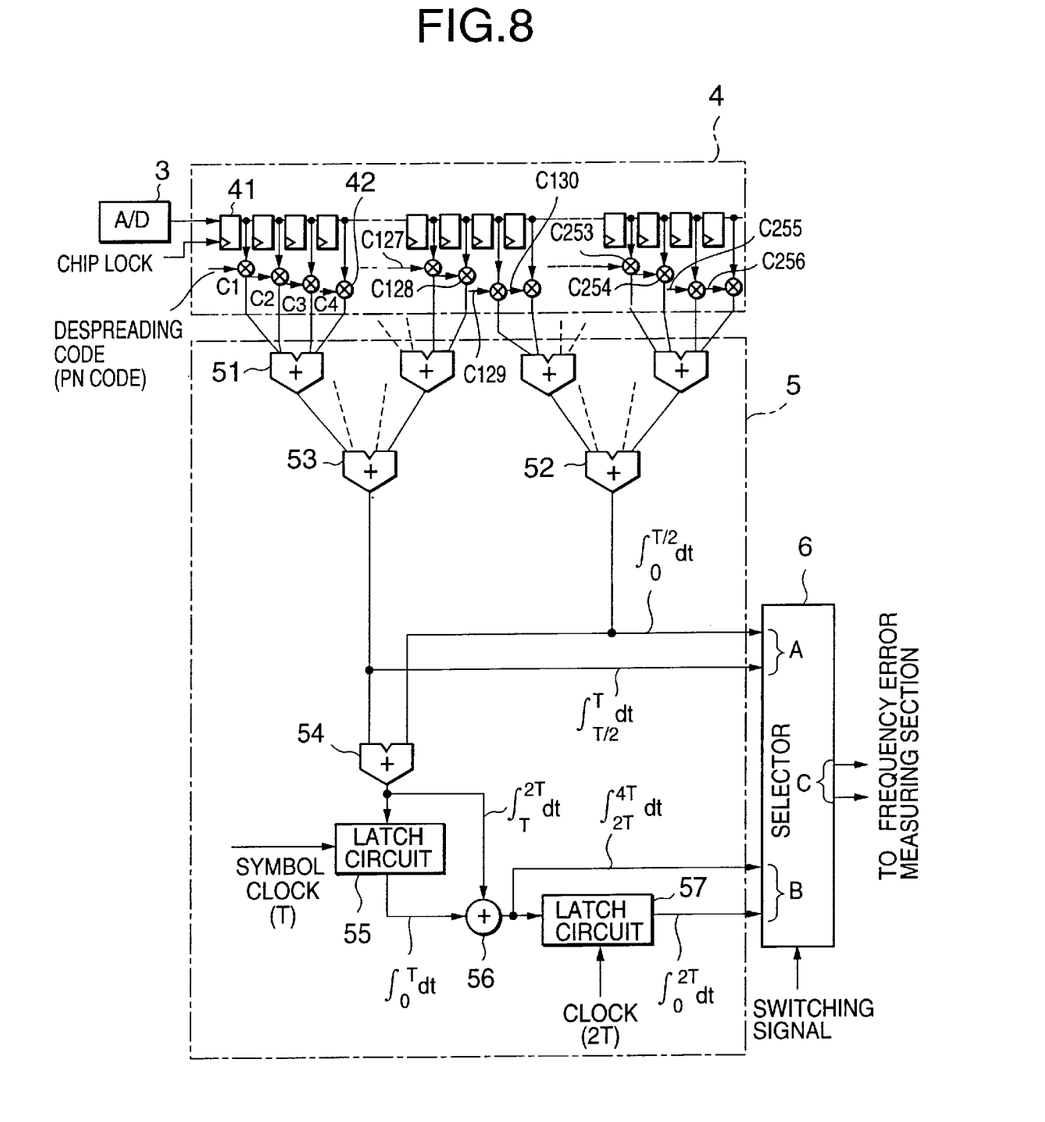
FIG. 8 is a block diagram showing the detailed arrangement of part of the embodiment shown in FIG. 7.

FIG. 8 is a block diagram showing the detailed arrangement of the despreading section 4 and integrator 5 in FIG. 7. The same reference numerals as in FIG. 6 denote the same parts in FIG. 8. The arrangement of the despreading section 4 is the same as that of FIG. 6. An adder 52 outputs the integral of the first half portion (0 to T/2) within one symbol, and an adder 53 outputs the integral of the second half portion (T/2 to T). These integral outputs are input to the A-side input terminals of the selector 6.

An adder 54 adds these integral outputs, and an output from the adder 54 is latched by a latch circuit 55 having a clock with a symbol period T as a latch timing, thereby obtaining an integral of one-symbol data (0 to T). An output from the adder 54 upon the elapse of the period T is an integral of the next one-symbol data (T to 2T). The output from the latch circuit 55 and the output from the adder 54 are added by an adder 56 to obtain an integral of two consecutive symbol data (0 to 2T). A latch circuit 57 is arranged to have a lock with the period 2T as a latch timing. An output from the adder 56 is input to the latch circuit 57. The integrals of 0 to 2T and 2T to 4T appear at outputs of the adder 56 and latch circuit 57, respectively. These outputs serve as the B-side inputs to the selector 6.

Figure 9:
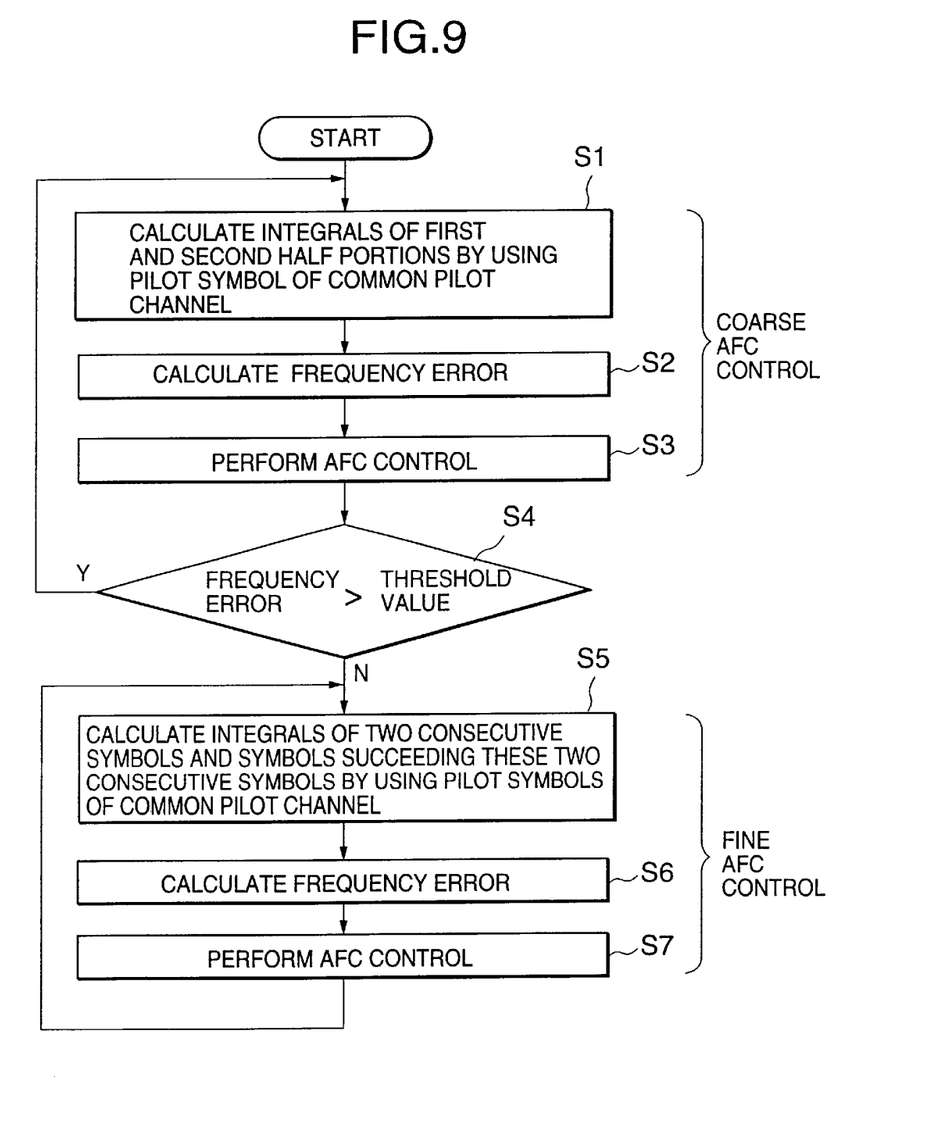
FIG. 9 is a flow chart showing operation of the embodiment shown in FIG. 7.

FIG. 9 is a schematic flow chart showing operation of this embodiment of the present invention. In the initial state upon power-on, the pilot symbol of the common pilot channel is used, and the selector 6 selects the integral of the first and second half portions of one symbol (step S1). The frequency error measuring section 7 calculates the phase shift amount of these two integrals to measure a frequency error (step S2). AFC control is performed on the basis of this frequency error (step S3). The control section 10 monitors this frequency error. When the frequency error is less than the threshold value (step S4), the control section 10 determines that the frequency error becomes small and a stable state is set. The control section 10 then performs fine AFC control.

In this case, the selector 6 selects the B-side inputs, and integrals of the two consecutive pilot symbols of the common pilot channel are used (step S5). A phase shift amount is detected by the integrals of these two consecutive pilot symbols, thereby measuring a frequency error (step S6). AFC control is performed on the basis of this frequency error (step S3).

Figure 11B:
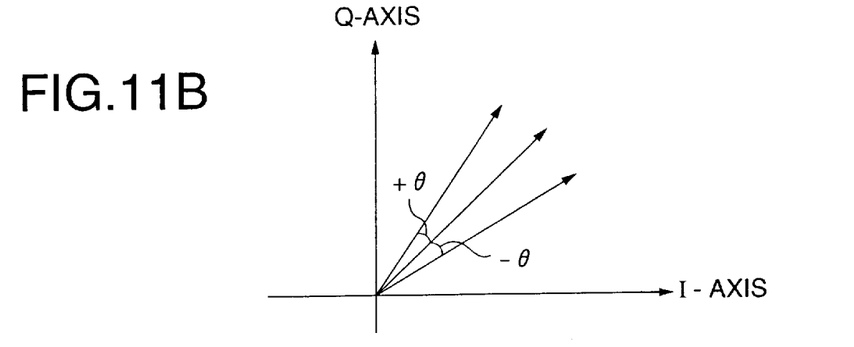
Figure 11C:
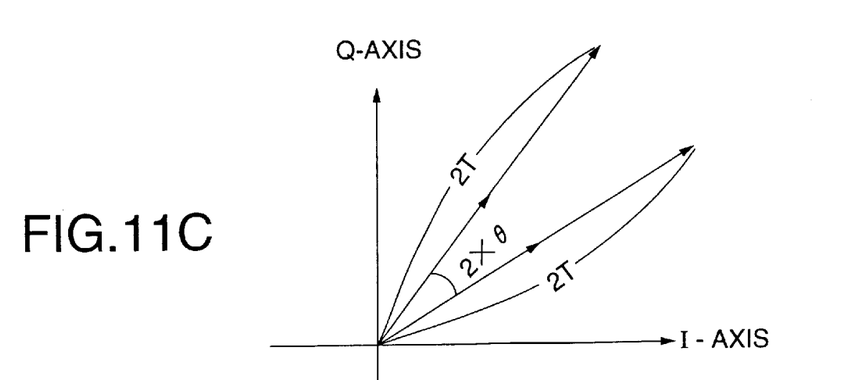

Assume that AFC is stable. In this case, when the vectors of the integrals of one-pilot symbol are represented by D1 and D2, respectively, the influence of noise on the vectors is shown in FIG. 11A, as described with reference to the description of the prior art. In this case, the phase shift amount of the vectors changes within the range of ±θ (value smaller than the threshold value), as shown in FIG. 11B. According to the present invention, since the present invention uses the integrals (every 2T) of the two consecutive symbols, the integrating time is prolonged to 2T, as shown in FIG. 11C, thereby allowing more accurate detection of the phase shift amount free from the adverse influence of noise.

Exemplifying the relationship between the phase rotation amount (phase shift amount) and frequency error between two pairs of consecutive symbols (between first and second pilot symbols and the third and fourth pilot symbols) for a reference, when the symbol rate and the phase rotation amount between the two symbols are 15 ksps and 90 degrees, respectively, the frequency error is given by Frequency error θ=(15 ksps/2)×(90 degrees/360 degrees)=1.87 kHz If the carrier frequency is 2 GHz, a shift of 1.875 kHz becomes a frequency error of 0.9375 ppm.

Figure 10:
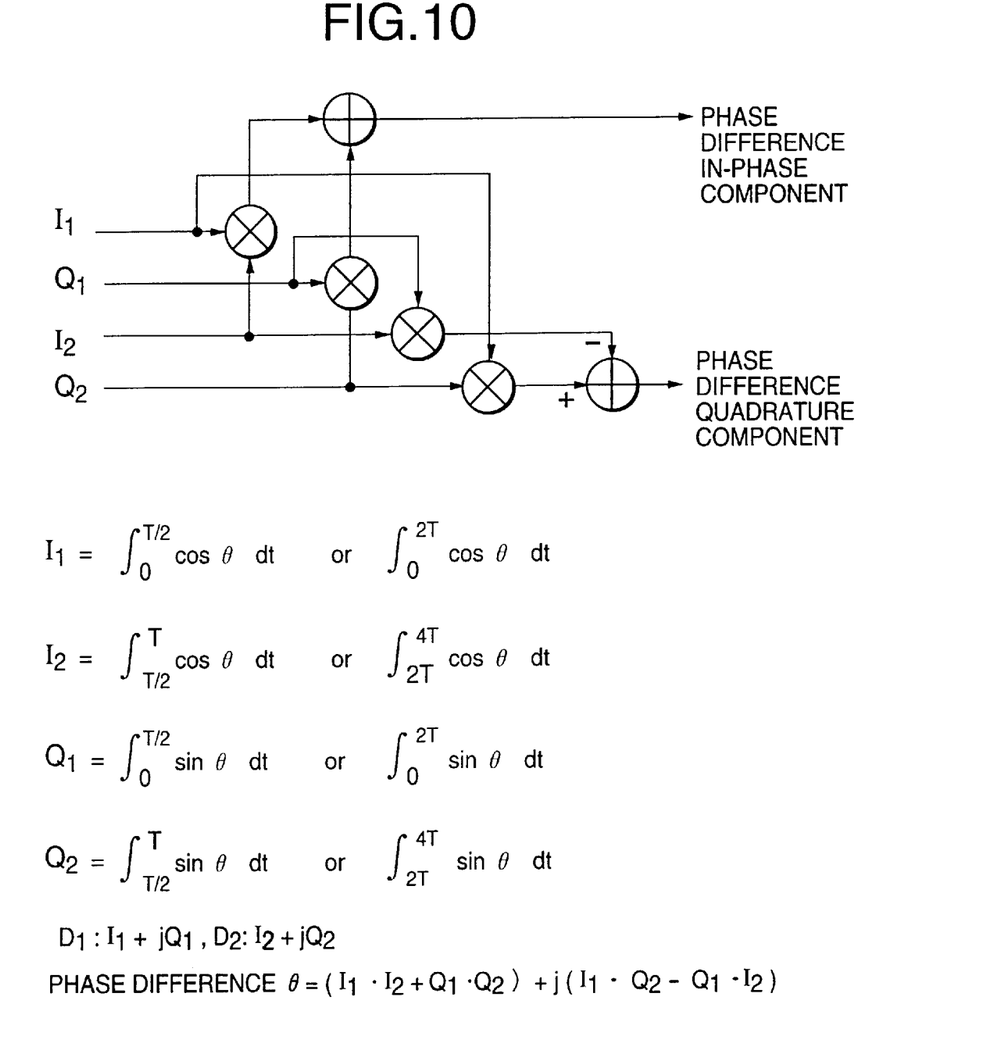
FIG. 10 is a view showing the detailed arrangement of a frequency error measuring section of the embodiment of the present invention.

Note that an arrangement of the frequency error measuring section 7 is shown in FIG. 10 and can be made up of adders and multipliers. Symbol data D1 and D2 in FIG. 10 are represented by I (in-phase) and Q (quadrature) components, respectively. In the description of the embodiment shown in FIGS. 7 to 9, the I and Q components are not discriminated from each other for descriptive convenience. In practice, the vector data have I and Q components, as a matter of course.

In the above embodiment, in coarse AFC control, one symbol is divided into the first and second half portions. However, one symbol may be divided into three or more portions. When the division number becomes large, an accurate phase shift amount cannot be measured because the integration time becomes short. In fine AFC control, integration values are obtained in units of two symbols. However, integration values in units of three or more symbols can be naturally obtained.

What is claimed is:

1. An automatic frequency control (AFC) apparatus in mobile communications equipment, which receives a spread signal, and multiplies a reception signal with a reference signal to obtain a baseband signal, the AFC control apparatus comprising:

despreading means for despreading the baseband signal;

a first integrating means for:

a) integrating N consecutive first pilot symbols contained in a pilot channel of the despread baseband signal to produce a first integral output, wherein N is a number ≧2, and b) integrating N second pilot symbols succeeding the N first pilot symbols to produce a second integral output; and control means for detecting a phase shift amount between the first and second integral outputs and controlling a frequency of the reference signal in accordance with the detected phase shift amount.

2. An apparatus according to claim 1, wherein aid apparatus further comprises second integrating means for dividing a despread output of one symbol of the reception signal from said despreading means and integrating the divided despread outputs, and said control means detects a phase shift amount between the integrated divided despread outputs from said second integrating means and performs the frequency control when the phase shift amount is larger than a predetermined threshold value.

3. An apparatus according to claim 2, wherein when the phase shift amount is less than the predetermined threshold value, said control means detects a phase shift amount between the first and second integral outputs and performs the frequency control.

4. An apparatus according to claim 2, wherein one symbol of the baseband signal comprises a pilot symbol contained in the pilot channel.

5. An automatic frequency control (AFC) method in mobile communications equipment, wherein the equipment receives a spread signal, and multiplies a reception signal with a reference signal to obtain a baseband signal, the method comprising the steps of:

a) despreading the baseband signal;

b) integrating N consecutive first pilot symbols contained in a pilot channel of the despread baseband signal, wherein N is an integer ≧2;

c) generating a first integral output from step (b);

d) integrating N second symbols succeeding the N first pilot symbols;

e) generating a second integral output from step (d);

f) detecting a phase shift amount between the first and second integral outputs and g) controlling a frequency of the reference signal in accordance with the detected phase shift amount.

6. A method according to claim 5, further comprising the step of dividing a despread output of one symbol of the baseband signal from step (a) and integrating the divided despread outputs, and wherein steps (f) and (g) include detecting a phase shift amount between the integrated divided despread outputs from said and performing the frequency control when the phase shift amount is larger than a predetermined threshold value.

7. A method according to claim 6, wherein when the phase shift amount is less than the predetermined threshold value, the control step comprises detecting a phase shift amount between the first and second outputs and performing the frequency control.

8. An AFC control method in mobile communications equipment, wherein the equipment receives a spread signal, and multiplies a reception signal with a reference signal to obtain a baseband signal, the method comprising the steps of:

a) despreading the baseband signal in response to power-on;

b) dividing a despread output of one symbol of the baseband signal in step (a) to produce divided despread outputs c) integrating the divided despread outputs to produce integrated outputs;

d) detecting a first phase shift amount between the integrated outputs and performing frequency control based on a first phase shift amount calculated from the integrated outputs;

when the first phase shift amount is less than a predetermined threshold value, performing the steps (e)–(g):

e) integrating N consecutive first pilot symbols contained in a pilot channel of the despread baseband signal to produce a first integral output, wherein N is a number $\geq 2$, f) integrating N second pilot symbols succeeding the N first pilot symbols, to produce a second integral output; and g) detecting a second phase shift amount between the and second integral outputs and controlling a frequency of the reference signal in accordance with the detected second phase shift amount.

9. Mobile communications equipment using an AFC control apparatus, the AFC control apparatus receiving a spread signal, and multiplying a reception signal with a reference signal to obtain a baseband signal, the AFC control apparatus comprising:

despreading means for despreading the baseband signal;

a first integrating means for:

a) integrating N consecutive first pilot symbols contained in a pilot channel of the despread baseband signal to produce a first integral output, wherein N is a number $\geq 2$, b) integrating N second pilot symbols is succeeding the N first pilot symbols to produce a second integral output; and control means for detecting a phase shift amount between the first and second integral outputs and controlling a frequency of the reference signal in accordance with the detected phase shift amount.

10. Mobile communications equipment using an automatic frequency control (AFC) apparatus, the AFC control apparatus receiving a spread signal and multiplying a reception signal with a reference signal to obtain a baseband signal, the AFC control apparatus comprising:

despreading means for despreading the baseband signal;

dividing means for dividing a despread output of one symbol of the reception signal, and producing divided despread outputs;

first integrating means for integrating the divided despread outputs and producing integrated outputs;

detecting means for detecting a first phase shift amount between the integrated outputs and performing frequency control;

second integrating means for:

a) integrating N consecutive first pilot symbols contained in a pilot channel of the despread baseband signal to produce a first integral output, wherein N is a number $\geq 2$, b) integrating N second pilot symbols succeeding the N first pilot symbols to produce a second integral output;

control means for detecting a second phase shift amount between the first and second integral outputs and controlling a frequency of the reference signal in accordance with the detected second phase shift amount when the first phase shift amount is less than a predetermined threshold.

11. Mobile communication equipment according to claim 9, wherein said equipment employs a CDMA communication scheme.

12. Mobile communication equipment according to claim 10, wherein said equipment employs a CDMA communication scheme.

* * * * *